United States Patent
Montanari et al.

(10) Patent No.: US 12,341,477 B2
(45) Date of Patent: Jun. 24, 2025

(54) BANDWIDTH ENHANCED GAIN STAGE WITH IMPROVED COMMON MODE REJECTION RATIO

(71) Applicant: Huawei Technologies Co., Ltd., Shenzhen (CN)

(72) Inventors: Daniele Montanari, Segrate (IT); Luca Romanò, Segrate (IT)

(73) Assignee: Huawei Technologies Co., Ltd., Shenzhen (CN)

( * ) Notice: Subject to any disclaimer, the term of this patent is extended or adjusted under 35 U.S.C. 154(b) by 649 days.

(21) Appl. No.: 17/645,834

(22) Filed: Dec. 23, 2021

(65) Prior Publication Data
US 2022/0115993 A1  Apr. 14, 2022

Related U.S. Application Data

(63) Continuation of application No. PCT/EP2019/066758, filed on Jun. 25, 2019.

(51) Int. Cl.
*H03F 3/45* (2006.01)
*H03F 1/42* (2006.01)

(52) U.S. Cl.
CPC .......... *H03F 1/42* (2013.01); *H03F 3/45076* (2013.01); *H03F 2200/36* (2013.01)

(58) Field of Classification Search
CPC .... H03F 1/42; H03F 3/45076; H03F 2200/36; H03F 2203/45481; H03F 1/347; H03F 3/45085; H03F 3/45511; H03F 2203/45228; H03F 2203/45662; H03F 2203/45731
USPC ........................................................ 330/252
See application file for complete search history.

(56) References Cited

U.S. PATENT DOCUMENTS

| | | | |
|---|---|---|---|
| 7,005,920 B2 | 2/2006 | Mukherjee et al. | |
| 7,142,596 B2 | 11/2006 | Pavan | |
| 8,264,278 B2 * | 9/2012 | Kanda | H03F 3/211 330/54 |
| 9,979,188 B2 | 5/2018 | Mu | |
| 2005/0062533 A1 | 3/2005 | Vice | |
| 2005/0162229 A1 * | 7/2005 | Notthoff | H03F 3/45085 330/252 |

(Continued)

FOREIGN PATENT DOCUMENTS

| | | |
|---|---|---|
| CN | 101110576 A | 1/2008 |
| TW | 201310900 A | 3/2013 |

OTHER PUBLICATIONS

Zhang, B. et al., "Design of coherent receiver optical front end for unamplified applications," Optical Society of America, Optics Express, vol. 20, No. 3, Jan. 30, 2012, pp. 3225-3234.

(Continued)

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

The present disclosure relates to a gain stage for an amplifier and to the amplifier. The amplifier may be a broad-band amplifier, trans-impedance amplifier and/or driver amplifier. The gain stage includes a differential input transconductor, a loading network and a differential output terminal. Further, the gain stage includes at least one pair of inductances connected within the loading network or between the differential input transconductor and the differential output terminal.

20 Claims, 17 Drawing Sheets

(56) References Cited

U.S. PATENT DOCUMENTS

2019/0189734 A1   6/2019   Li et al.

OTHER PUBLICATIONS

Säckinger, E., "Broadband Circuits for Optical Fiber Communication", Agere Systems, Mar. 28, 2002, 116 pages.
Galal, S. et al., "40-GB/s Amplifier and ESD Protection Circuit in 0.18-µm CMOS Technology," IEEE Journal of Solid-State Circuits, vol. 39, No. 12, Dec. 2004, pp. 2389-2396.

* cited by examiner

BANDWIDTH ENHANCED GAIN STAGE WITH IMPROVED COMMON MODE REJECTION RATIO

CROSS-REFERENCE TO RELATED APPLICATIONS

This application is a continuation of International Application No. PCT/EP2019/066758, filed on Jun. 25, 2019, the disclosure of which is hereby incorporated by reference in its entirety.

TECHNICAL FIELD

The present disclosure relates to a gain stage for an amplifier, and to the amplifier comprising the gain stage. The amplifier can in particular be a broad-band amplifier, transimpedance amplifier and/or driver amplifier. The gain stage can in particular be one of multiple differential gain stages of the amplifier. The gain stage has an enhanced bandwidth and Common Mode Rejection Ratio (CMRR).

BACKGROUND

The requirement of high data-rate communications increases the demand, for instance, of broadband transimpedance amplifiers (TIAs) and drivers, in which signal bandwidth in the order of tens of GHz is to be processed without any loss of information. The use of coherent detection in optical communication systems enables superior receiver (RX) sensitivity, compared to the use of direct detection, provided that a high enough CMRR is achieved in the receiving chain.

There exists a relationship between the CMRR and the RX sensitivity. For instance, it can be shown that for a Local Oscillator (LO) power of 14 dBm, the RX sensitivity degrades from −34 to −25 dBm, if the CMRR drops from 35 to 15 dB. Unfortunately, as will be shown the following standard circuit topologies for amplifiers suffer from poor CMRR at high frequencies.

An example of a differential TIA/driver for coherent optical communication systems includes a cascade of several gain stages. FIG. 11 shows such a gain stage. In particular, it shows a simple fully differential gain stage in bipolar technology including an input differential pair (transistors Q1 and Q2) with a resistive load (R1 and R2). Capacitors C1/C2, and C3/C4, take into account the parasitic capacitance at the output node related to the gain stage, and to the next gain stage respectively. Q3 and Q4 represent the next gain stage. The bandwidth of the gain stage is limited by the parasitic capacitance at the output node, which leads to a first order low-pass transfer function with a single real pole at $$f_{-3dB} = 1/(2\pi R_1 C_{tot}),$$

where $$C_{tot} = C1 + C2.$$

The use of integrated inductances (inductors) allows improving significantly the −3 dB bandwidth of the gain stage. FIG. 12 shows accordingly the gain stage of FIG. 11, in which inductances L1 and L2 are added in series to the load resistors R1 and R2. FIG. 13 shows the gain stage of FIG. 11, in which two inductances L1 and L2 are added in between the gain stages, splitting the loading capacitors C1/C2, and C3/C4. The two topologies are referred to as Shunt Peaking topology (FIG. 12) and Inductive Interstage Network topology (FIG. 13), respectively, and offer a significant improvement in terms of bandwidth. As further shown in FIG. 14, also a Triple-Resonance Network (TRN) topology may be provided, which combines the two previous solutions: i.e. inductances L1 and L2 are added in series to the load resistors R1 and R2, while inductances L3 and L4 are placed in between the gain stages. FIG. 15 shows the normalized transfer function for these three cases, comparing them in particular with the inductance-less gain stage of FIG. 11.

While introducing a significant bandwidth improvement, the above-presented networks/gain stages do not provide any kind of Common Mode Rejection (CMR). The required CMRR is thus typically achieved through the use of a fully differential circuit as the input differential pair and a tail current generator, as shown in FIG. 16. The tail current generator can be modelled as an ideal generator Io with a finite output resistance R0. Since its value is typically high, the common mode transconductance is strongly degenerated.

However, any parasitic capacitance $C_{par}$ at the node X lowers the impedance, and the CMRR rapidly decreases as the frequency goes up. This is illustrated in FIG. 17. Due to the fact that most of the parasitic capacitance comes from the tail current generator, a possible solution is to add a resistor in series to it. The main drawback of this solution is, however, that the value of the resistance is limited by the maximum voltage drop and, considering large bias currents, the resistance does not improve the CMRR significantly. Instead of a resistor, a series inductance can be added, but at the price of a large area occupation.

SUMMARY

In view of these disadvantages, embodiments of the present invention aim to improve the above-described exemplary gain stages. An objective is to provide a gain stage with enhanced bandwidth and with improved CMRR. In particular, the gain stage should have a significantly improved CMRR at high frequencies. Furthermore, the improved CMRR should also be achieved at large bias currents. In addition, a small area occupation of the gain stage is also a goal of the invention.

This is achieved by the embodiments of the invention as described in the enclosed independent claims. Advantageous implementations of the embodiments of the invention are further defined in the dependent claims.

In particular, a gain stage with improved CMRR at high frequencies is presented. The gain stage can be used in applications, for which a high CMRR and a large bandwidth are crucial, such as (but not limited to):
 Broadband TIAs for optical communications
 Broadband drivers for optical communications
 Broadband amplifiers for wideband Radio Frequency (RF) transceivers.

The embodiments of the gain stage are based on the use of coupled inductances (i.e. transformers), which are introduced into the above-described exemplary gain stages.

A first aspect of the invention provides a gain stage for an amplifier, wherein the gain stage comprises: a differential input transconductor, a loading network and a differential output terminal, at least one pair of inductances connected within the loading network or between the differential input transconductor and the differential output terminal, wherein the inductances of at least one pair of inductances are coupled.

The CMRR of the gain stage of the first aspect is improved by the coupling of the inductances, in particular in the high frequency range. The CMRR increases as the coupling factor k between the at least one pair of inductances increases. The improved CMRR is achieved without degrading the differential transfer function of the gain stage. Further, considering a desired inductance value, the total area occupation of the gain stage can be reduced, in particular, as the coupling factor k increases. Thus, an overall improved gain stage with enhanced bandwidth and CMRR is provided.

In an implementation form of the first aspect, the gain stage comprises: a pair of load resistors connected to the differential input transconductor, and a first pair of inductances connected in series to the pair of load resistors, wherein the inductances of the first pair of inductances are coupled.

The pair of load resistors and the first pair of inductances may form the loading network. That is, the first pair of inductances is connected within the loading network. This allows realizing an improved gain stage based on a Shunt Peaking Topology or TRN topology.

In an implementation form of the first aspect, the gain stage comprises: a second pair of inductances connected between the differential input transconductor and the differential output terminal, wherein the inductances of the second pair are coupled.

This allows realizing an improved gain stage with Inductive Interstage Network topology or TRN topology. The TRN topology is obtained when both the first pair and the second pair of inductances is added and provided with the coupling.

In an implementation form of the first aspect, the resonant circuit comprises a first pair of loading capacitors connected to the differential input terminal and a second pair of loading capacitors connected to the differential output terminal, and the second pair of inductances is connected between the first pair and the second pair of loading capacitors.

That is, the second pair of inductances may be added in between the gain stage and another gain stage.

In an implementation form of the first aspect, a first coupling factor between the inductances of the first pair of inductances is the same as a second coupling factor between the inductances of the second pair of inductances.

In an implementation form of the first aspect, a first coupling factor between the inductances of the first pair of inductances is different from the coupling factor between the inductances of the second pair of inductances.

In an implementation form of the first aspect, the first pair of inductances is coupled to the second pair of inductances.

This provides an additional boost to the inductance value in the two pairs of inductances, without degrading the CMRR.

In an implementation form of the first aspect, a coupling factor between the inductances of at least one pair of inductances is larger than 0.1, particularly larger than 0.25.

This leads to an improvement of the CMRR.

In an implementation form of the first aspect, a coupling factor between the inductances of at least one pair of inductances is in a range of 0.3-0.7, in particular in a range of 0.4-0.6.

This leads to a significant improvement of the CMRR.

In an implementation form of the first aspect, the differential input transconductor includes control terminals of two first transistors, and the differential output terminal includes control terminals of two second transistors.

The two second transistors may also form a differential input transconductor of a next gain stage, e.g. in an amplifier comprising multiple gain stages.

In an implementation form of the first aspect, the gain stage comprises a tail current generator connected to the differential input terminal.

The inclusion of the tail current generator further improves the CMRR of the gain stage.

In an implementation form of the first aspect, the gain stage is based on a Shunt Peaking topology, an Inductive Interstage Network topology, or a Triple Resonant Network topology.

Thus, the solution provided by embodiments of the invention is can be flexibly used for different topologies and amplifier configurations.

In an implementation form of the first aspect, the inductances of at least one pair of inductances are implemented in Complementary Metal-Oxide-Semiconductor (CMOS) technology, in SiGe Bipolar-CMOS technology, or in GaAs technology.

In this way, for instance, a gain stage for very high frequency applications can be made.

In an implementation form of the first aspect, the inductances of at least one pair of inductances are distributed over at least two separated metal layers.

In this way, a particularly compact solution can provided for one pair or two pairs of coupled inductances.

A second aspect of the invention provides an amplifier, particularly a broad-band amplifier, TIA and/or driver amplifier, comprising at least one gain stage according to the first aspect or any of its implementation forms.

The amplifier of the second aspect enjoys all advantages and effects described above with respect to the gain stage of the first aspect and its various implementation forms. In particular, the amplifier benefits from the improved CMRR of one or more of its gain stages.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF THE DRAWINGS

The above described aspects and implementation forms of the present invention will be explained in the following description of specific embodiments in relation to the enclosed drawings, in which.

DETAILED DESCRIPTION OF ILLUSTRATIVE EMBODIMENTS

Figure 1:
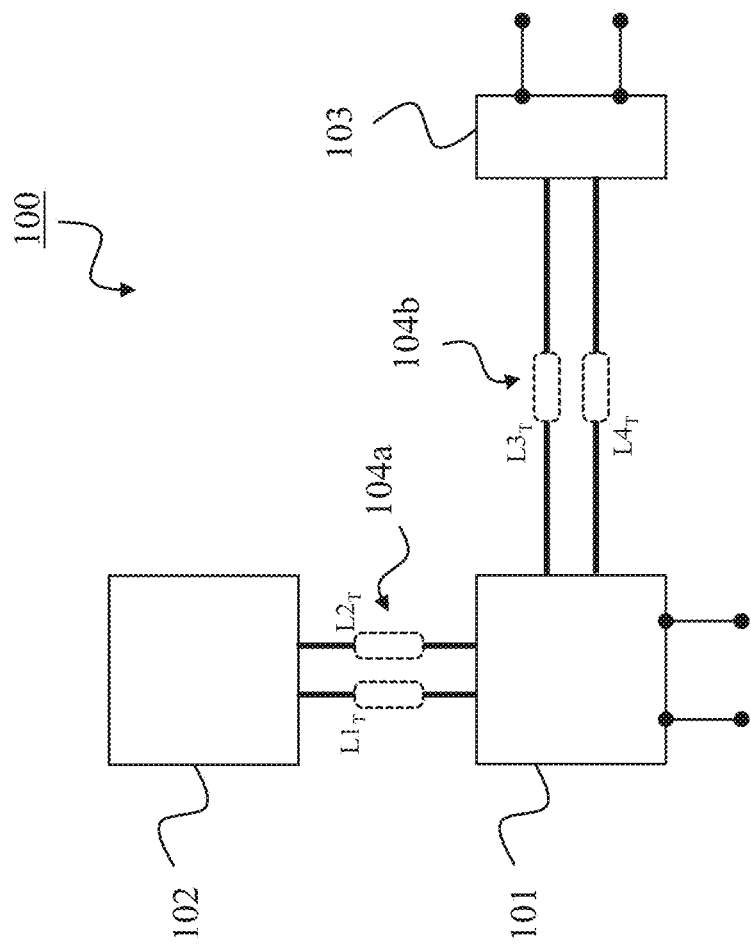
FIG. 1 shows a gain stage according to an embodiment of the invention.

FIG. 1 shows a gain stage 100 according to an embodiment of the invention. The gain stage 100 is configured to be used in an amplifier, particularly in a broad-band amplifier, a TIA and/or a driver amplifier. The amplifier comprises at least one gain stage 100, and in particular it may comprise multiple gain stages 100. The gain stage 100 may be a differential gain stage.

The gain stage 100 comprises a differential input transconductor 101, a loading network 102, and a differential output terminal 103. Further, the gain stage 100 comprises at least one pair 104a and/or 104b of inductances $L1_T$, $L2_T$, $L3_T$, $L4_T$, which are pairwise connected within the loading network 102 and/or are connected between the differential input transconductor 101 and the differential output terminal 103. Thus, the gain stage 100 can be based on a Shunt Peaking topology (with a first inductance pair 104 within the loading network 102), based on an Inductive Interstage Network topology (with a second inductance pair 104b between the transconductor 101 and the output terminal 103), or based on a Triple Resonant Network topology (with both the first inductance pair 104a and the second inductance pair 104b).

In order to enhance the CMRR of the gain stage 100, the inductances $L1_T$, $L2_T$, $L3_T$, $L4_T$ of at least one pair 104a, 104b of inductances are coupled. That means, the inductances $L1_T$ and $L2_T$ of the inductance pair 104a may be coupled, and/or the inductances $L3_T$ and $L4_T$ of the inductance pair 104b may be coupled. In particular, the inductances in each pair 104a and 104b may be coupled to another. Furthermore, the inductance pair 104a may also be coupled to the inductance pair 104b.

Thus, a main feature of the gain stage 100 is the introduction of the coupling between the inductances of at least one pair 104a and 104b (i.e. transformers). This creates an unbalance between the differential and common mode frequency responses of the gain stage 100 at high frequencies. Further, this leads to an improved CMRR, especially at the high frequencies.

Figure 2:
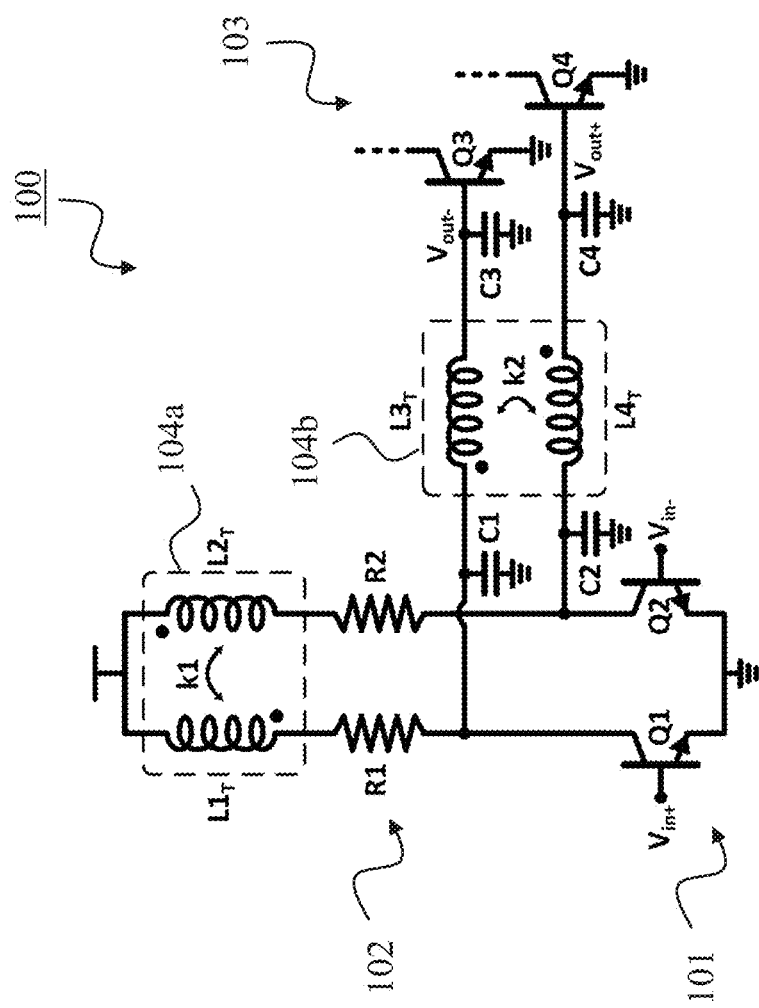
FIG. 2 shows a gain stage according to an embodiment of the invention, which is based on a TRN topology.

To understand this effect better, the gain stage 100 shown in FIG. 2 can be considered. The gain stage 100 shown in FIG. 2 builds on the gain stage 100 shown in FIG. 1, i.e. it is a more specific implementation thereof. Same elements in FIG. 1 and FIG. 2 share the same reference signs and function likewise.

The gain stage 100 of FIG. 2 is in the TRN configuration, i.e. it is based on a TRN topology with both inductance pairs 104a and 104b included. In particular, the gain stage 100 of FIG. 2 includes a pair of load resistors R1 and R2 connected to the differential input transconductor 101, and the first pair 104a of coupled inductances $L1_T$ and $L2_T$ is connected in series to the pair of load resistors R1 and R2. The gain stage 100 further includes capacitor pairs C1/C2 and C3/C4 taking into account the parasitic capacitance at the output node related to gain stage 100 and the next gain stage. The second pair 104b, of inductances $L3_T$ and $L4_T$ is connected between the differential input transconductor 101 and the differential output terminal 103, in particular between the capacitor pair C1/C2 and the capacitor pair C3/C4.

In the gain stage 100 of FIG. 2, the differential input transconductor 101 includes control terminals of two first transistors Q1 and Q2, and the differential output terminal 103 includes control terminals of two second transistors Q3 and Q4. The two second transistors Q3/Q4 may form also a differential input transconductor of a next gain stage.

As also shown in FIG. 2, coupling factor $k_1$ and $k_2$ are introduced between the loading inductances $L1_T$ and $L2_T$ of the first pair 104a, and the series inductances $L3_T$ and $L4_T$ of the second pair 104b, respectively. That is, the inductances $L1_T$ and $L2_T$ of the first pair 104a are coupled, and the inductances $L3_T$ and $L4_T$ of the second pair 104b are also coupled amongst each other. Moreover, to focus on the improvement given by the gain stage 100, a pseudo-differential input pair (Q1 and Q2 emitters toward ground) may be considered, thus removing any CMR coming from them (no tail current generator). The mutual inductance between $L1_T$ and $L2_T$—exemplarily in the first pair 104—can be expressed as:

$$M_{1-2} = k_1 \cdot \sqrt{L1_T \cdot L2_T} = k_1 \cdot L1_T$$

$L1_T = L2_T$ may thereby be assumed, since the gain stage 100 is differential and $0 < k_1 < 1$. This leads to the conclusion that the inductance seen in differential mode can be expressed as:

$$L1_{DM} = L1_T + M_{1-2} = L1_T \cdot (1 + k_1).$$

To obtain the same differential frequency response in the uncoupled scenario, each inductance in the transformer ($L1_T$ and $L2_T$) would have to be designed as $L1_T = L1/(1+k_1)$.

Notice that, for increasing k, the value of each inductance in the first pair 104a (transformer) is reduced (down to ½ of the single ended value for k=1), thus minimizing area occupation. While boosting the inductance value in differential mode, the coupling reduces the value of the common mode inductance, following the equation:

$$L1_{CM} = L1_T - M_{1-2} = L1_T \cdot (1 - k_1).$$

Figure 3:
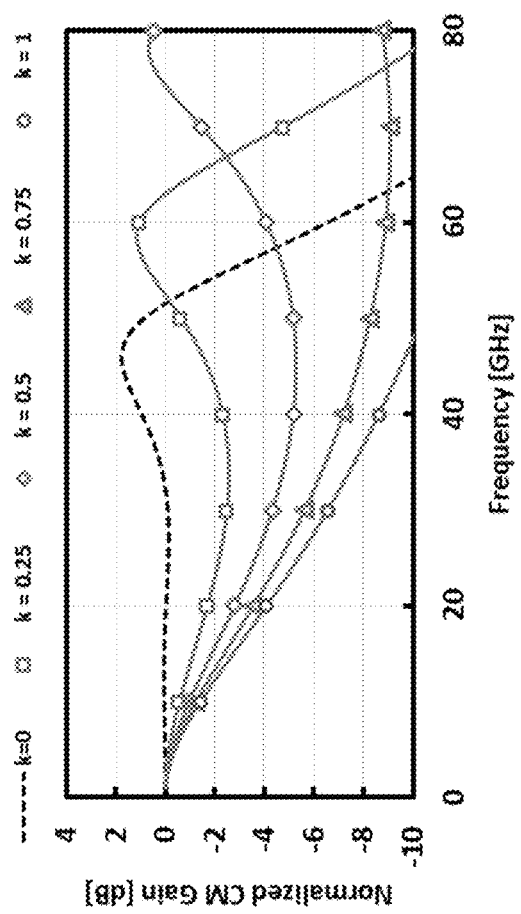
FIG. 3 shows normalized common mode gain versus frequency for different coupling factors k.
Figure 4:
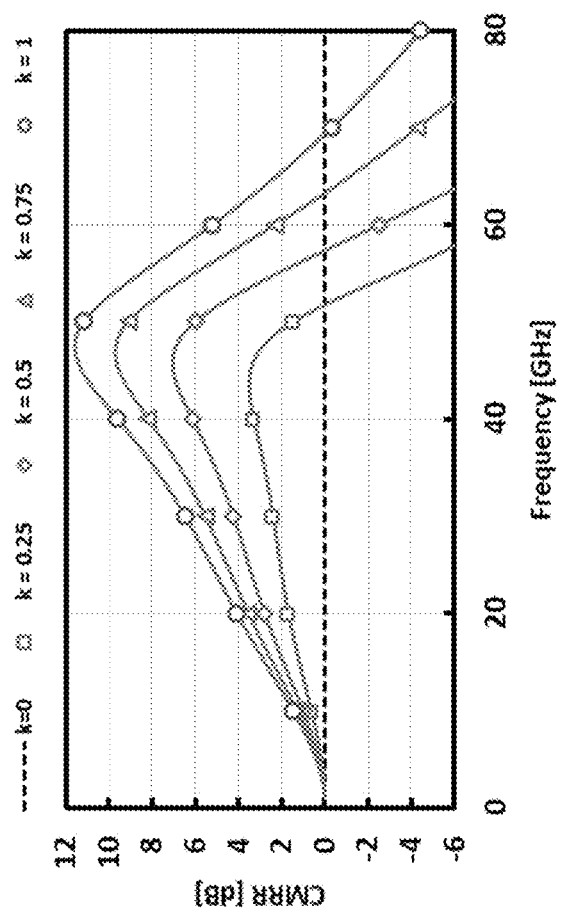
FIG. 4 shows CMRR improvement versus frequency for different coupling factors k. For increasing coupling factor k, the CMRR is improved in the high frequency range.

The same concept can be applied to the second pair 104b of inductances $L3_T$ and $L4_T$. In conclusion, for increasing k values (increasing coupling factors k), the differential transfer function can be kept constant, scaling down the inductances in the transformers, while the decrease of their common mode value reduces the bandwidth of the common mode frequency response, thus improving CMRR at high frequencies. This is illustrated in FIG. 3, in which the normalized common mode transfer functions versus frequency are shown for different coupling factors, assuming as an example $k=k_1=k_2$. Further, FIG. 4 depicts the CMRR in the same conditions. It can be seen that the higher the coupling factor k (here values k=0, k=0.25, k=0.5, k=0.75 and k=1 are compared), the stronger the CMRR of the gain stage 100 is improved, especially in the high frequency range. Generally, in the gain stage 100 of each described embodiment, either coupling factor k may be larger than 0.1, particularly larger than 0.25. More specifically, the coupling factor(s) k may be in a range of 0.3-0.7, in particular in a range of 0.4-0.6. The coupling factors of the two pairs 104a and 104b may be the same or may be different.

Figure 5:
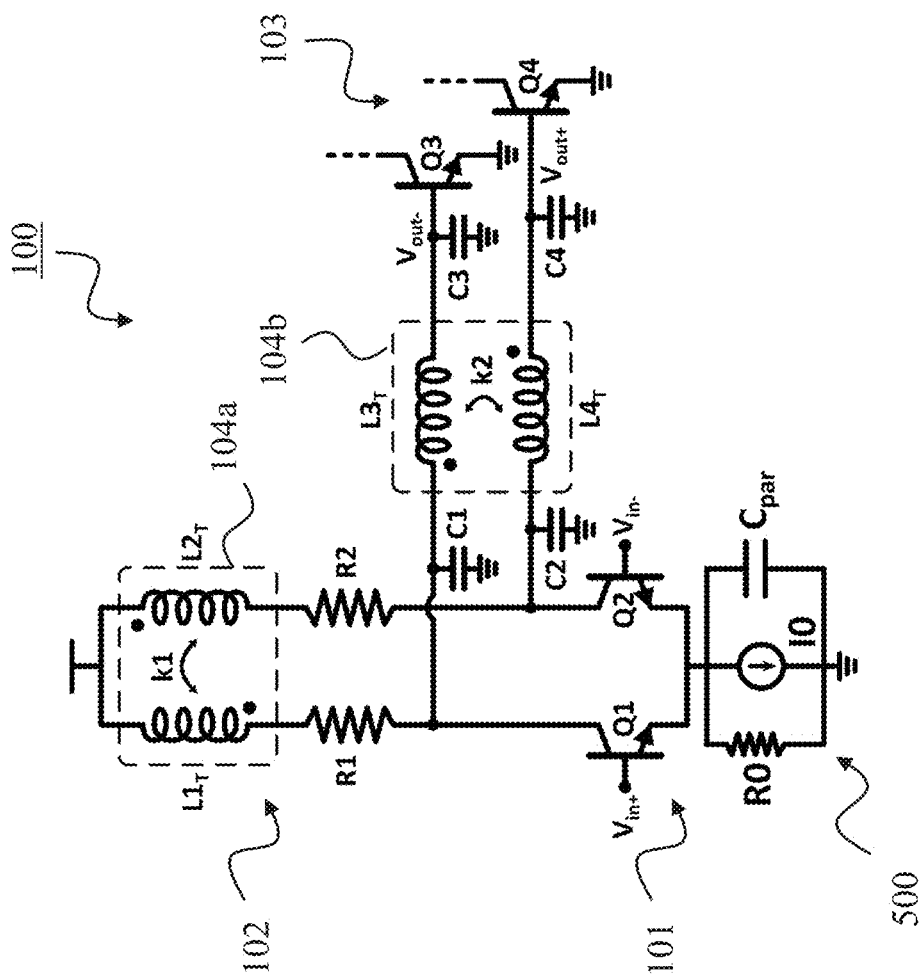
FIG. 5 shows a gain stage according to an embodiment of the invention including a tail current generator.
Figure 16:
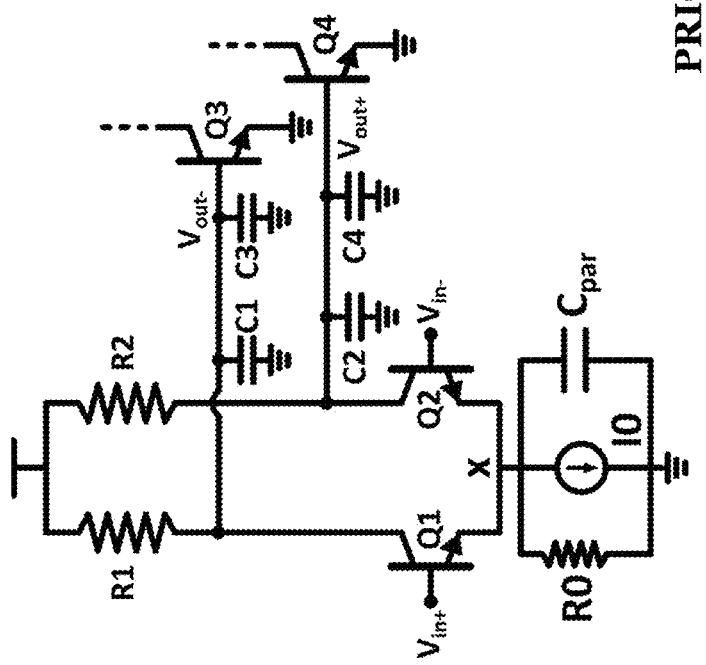
FIG. 16 shows an example of a gain stage including a tail current generator.
Figure 17:
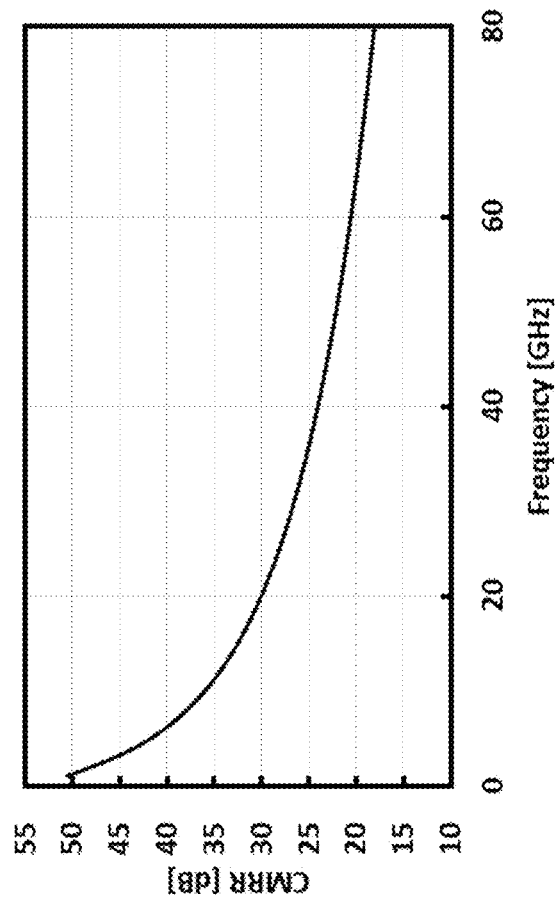
FIG. 17 shows CMRR versus frequency for an example gain stage including a tail current generator, as shown in FIG. 16.

In the following, it is explained in detail how a gain stage 100 according to an embodiment of the invention can be implemented based on the TRN topology. FIG. 5 shows such a gain stage 100, which builds on the gain stages 100 shown in FIG. 1 and FIG. 2, i.e. it is a more specific implementation thereof. Same elements in FIG. 1, FIG. 2 and FIG. 5 share the same reference signs and function likewise. The gain stage 100 shown in FIG. 5 comprises a tail current generator 500 connected to the differential input transconductor 101 terminal. The tail current generator 500 can be like the one shown in FIG. 16, and described in detail above.

Figure 6:
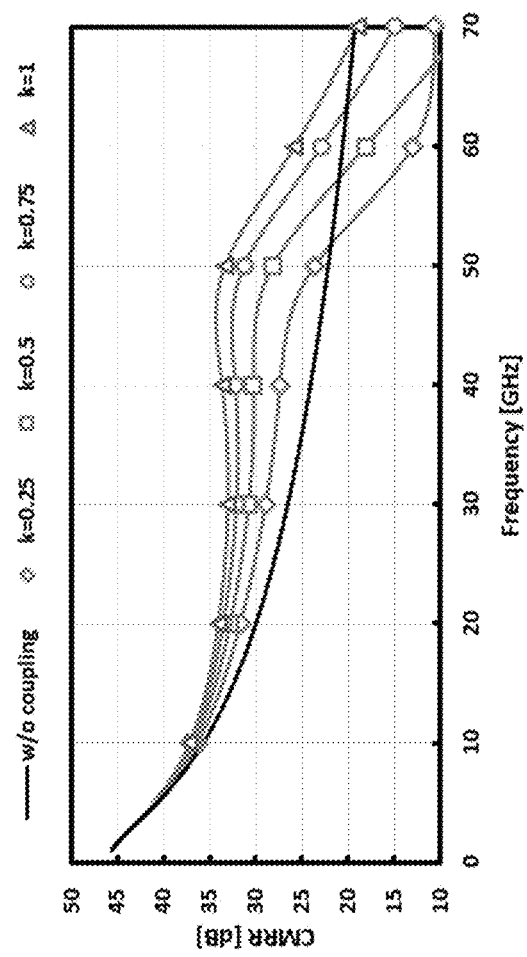
FIG. 6 shows CMRR versus frequency for a gain stage including a tail current generator, as shown in FIG. 5.

FIG. 6 shows the simulation results for the gain stage 100 of FIG. 5, wherein a fully differential input pair is used. Compared to the example gain stage of FIG. 16 (black curve in the plot of FIG. 6) without any inductance coupling, the CMRR of the gain stage 100 is improved, particularly in the high frequency range (regardless of how high the coupling factor k is). The example gain stage fails to achieve the required CMRR value.

Figure 7:
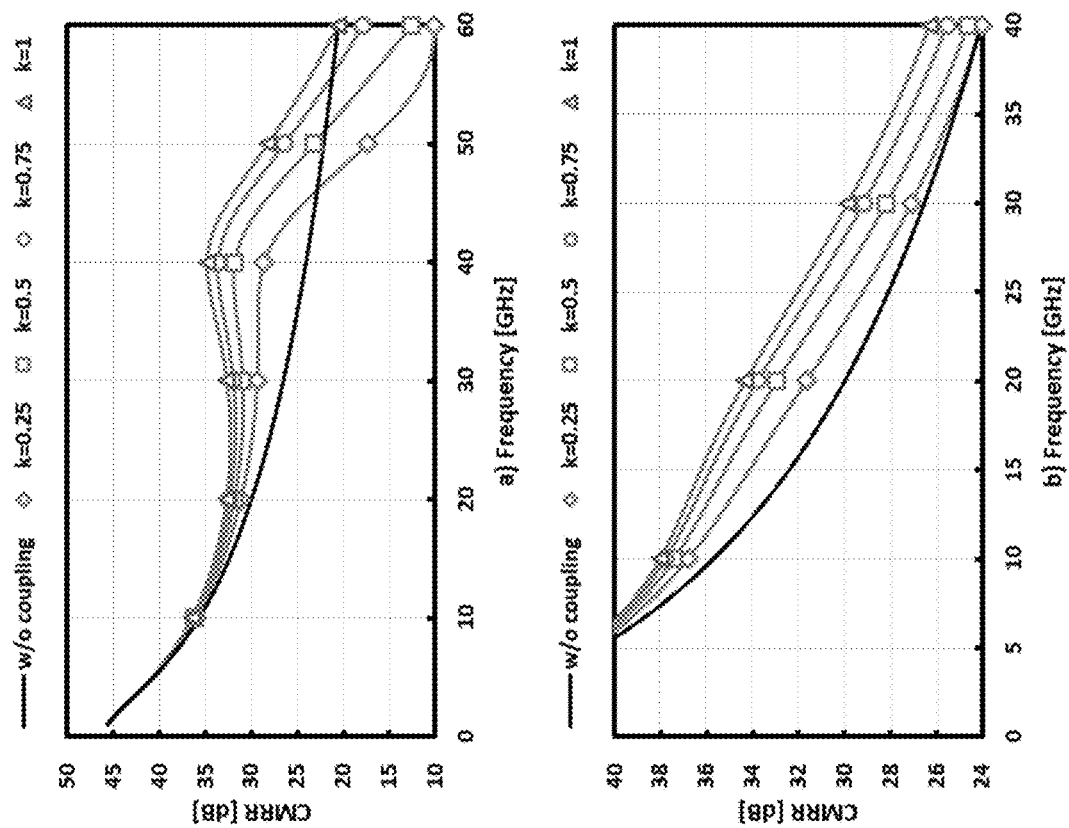
FIG. 7 shows CMRR versus frequency for different gain stages according to embodiments of the invention, namely (a) a gain stage based on an Inductive Interstage Network topology, and (b) a gain stage based on a Shunt Peaking topology.

In the same way, the coupling in the inductance pair 104a or 104b can be applied to a gain stage 100, which is based on a Shunt Peaking topology (i.e. only the first inductance pair 104a is included in the loading network 102) or to a gain stage 100, which is based on an Inductive Interstage Network topology (i.e. only the second inductance pair 104b is included between the input transconductor 101 and the output terminal 103). Simulation results for such gain stages 100 are shown in FIG. 7, demonstrating that the CMRR improves in both cases for an increasing coupling factor k, compared to example gain stages without any coupling.

For the gain stages 100 according to the embodiments of the invention, SiGe BiCMOS technology may be used, as it is currently the technology of choice for very high frequency applications (several tens of GHz). However, the same gain stages 100 can be fabricated with other IC technologies, such as (but not limited to) CMOS or GaAs. In particular, in the gain stages 100 according to embodiments of the invention, the inductances $L1_T$, $L2_T$, $L3_T$, $L4_T$ of at least one pair 104a, 104b of inductances may be implemented in CMOS technology, in SiGe BiCMOS technology, or in GaAs technology.

Figure 8:
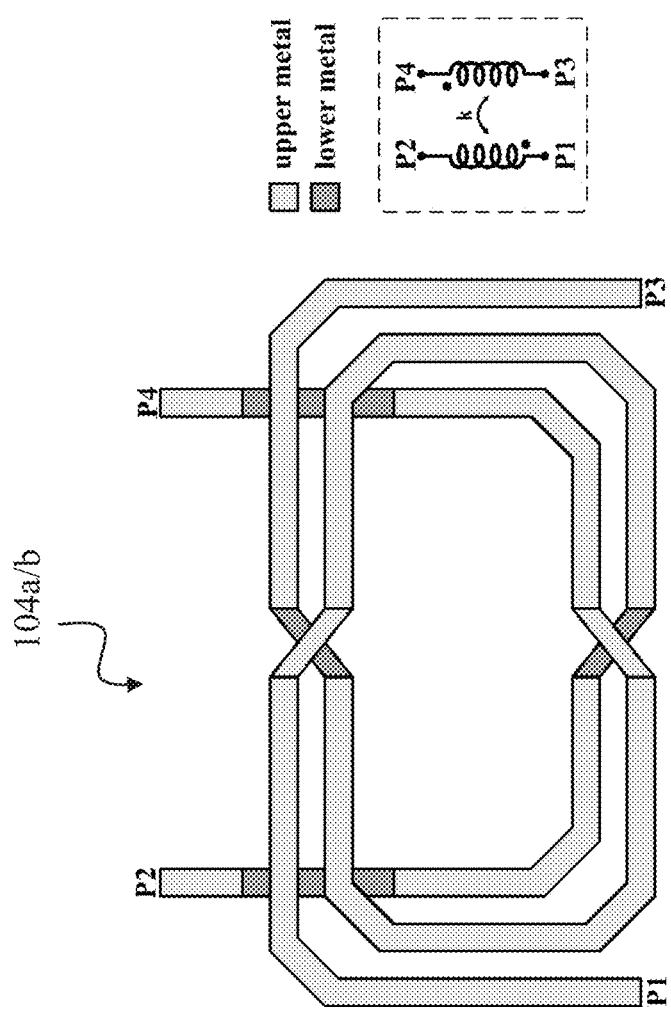
FIG. 8 shows a possible layout for realizing the coupled inductances of a gain stage according to an embodiment of the invention.

A layout example of an inductance pair (transformer), which can be used in all presented gain stages 100 either as the first inductance pair 104a or the second inductance pair 104b (or both), is shown in FIG. 8. For this layout, two metal layers are used, one ("upper metal layer") for the core of the inductances, and one ("lower metal layer") for the crossings. That is the inductances $L1_T$, $L2_T$, $L3_T$, $L4_T$ of the at least one pair 104a, 104b of inductances may be distributed over at least two separated metal layers.

Figure 9:
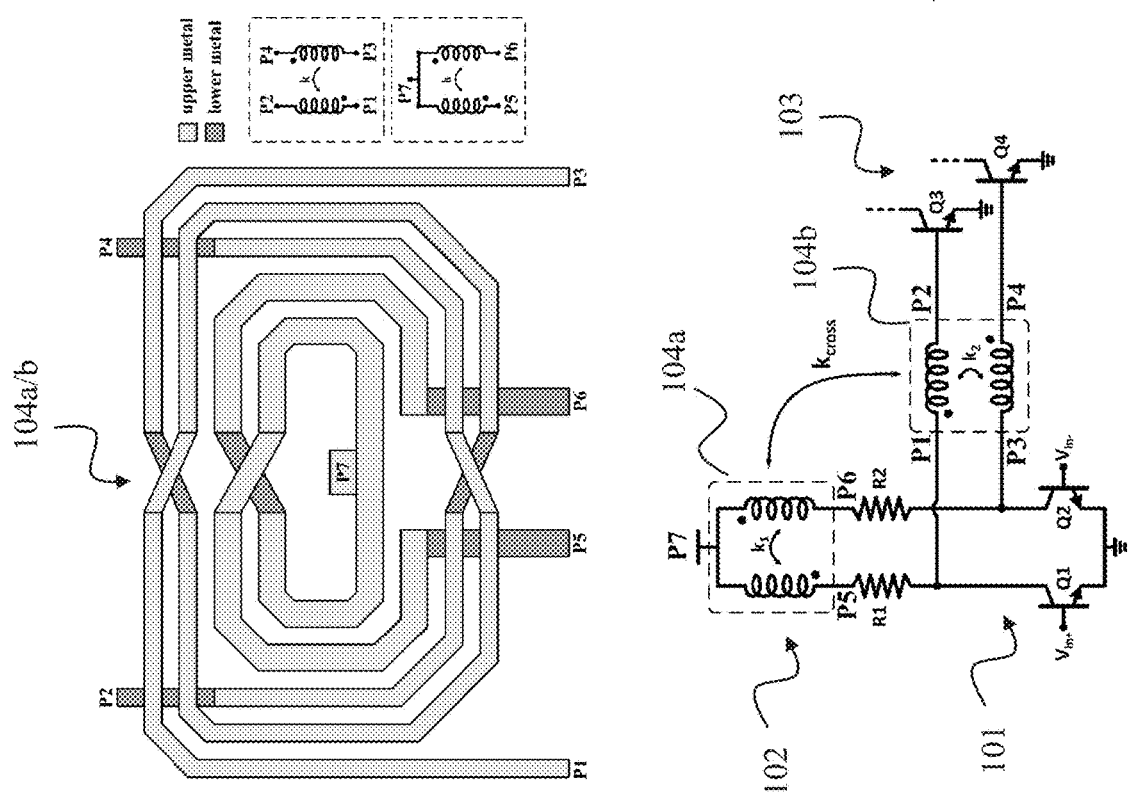
FIG. 9 shows a gain stage according to an embodiment of the invention, which is based on a TRN topology, and shows a possible layout for its coupled inductances.
Figure 10:
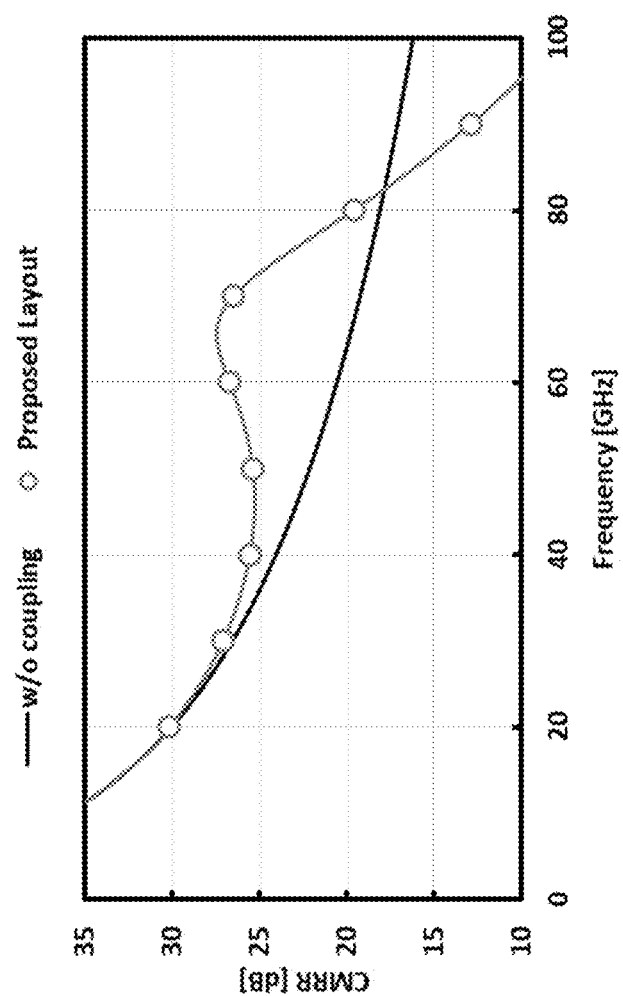
FIG. 10 shows CMRR versus frequency for a gain stage having the inductances layout shown in FIG. 9.
Figure 11:
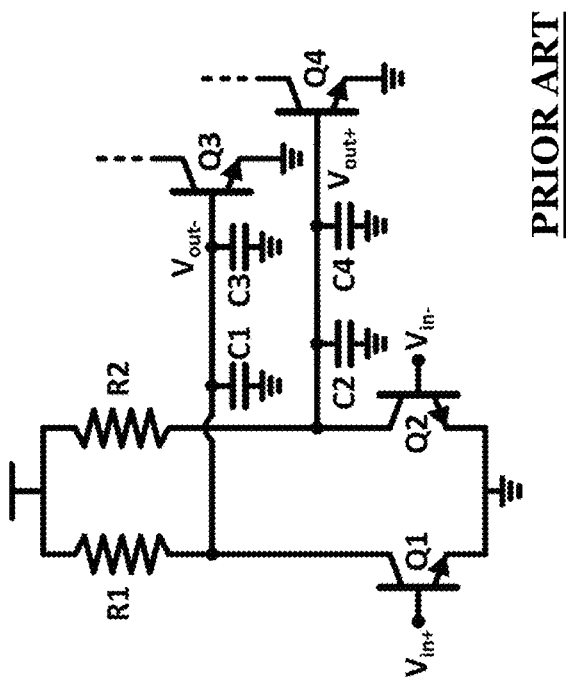
FIG. 11 shows an example of a gain stage for an amplifier.
Figure 12:
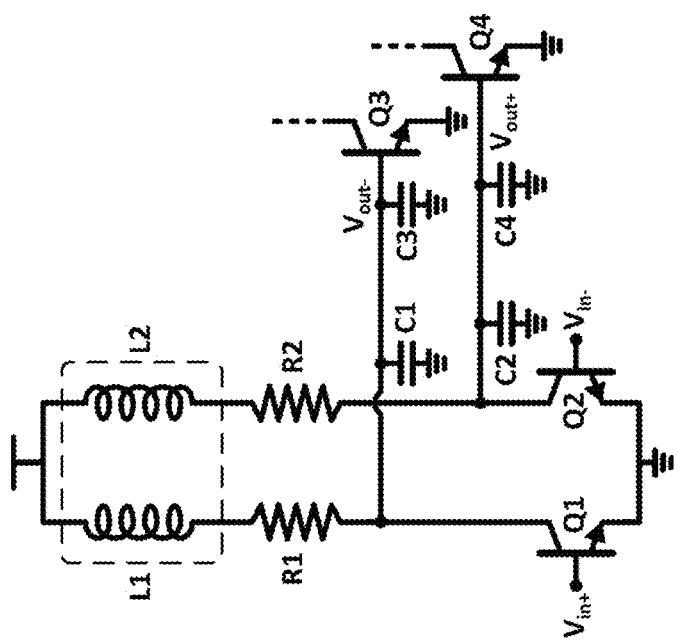
FIG. 12 shows an example of a gain stage, which is based on a Shunt Peaking topology.
Figure 13:
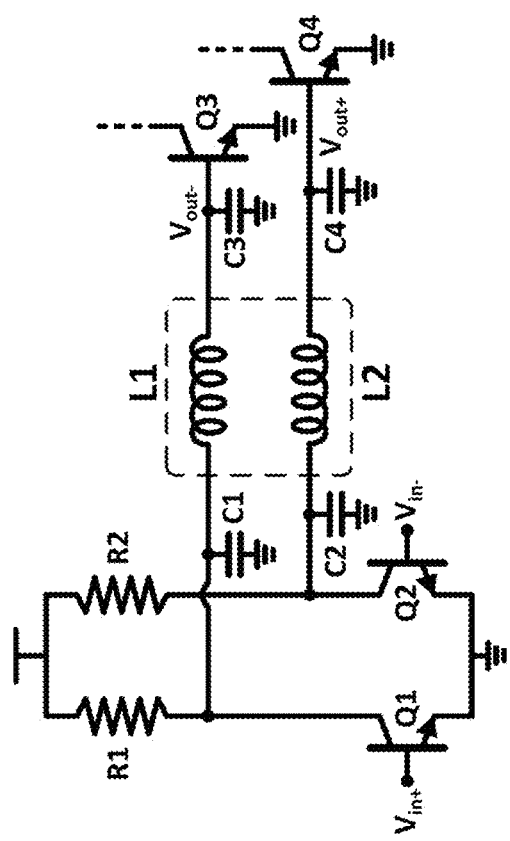
FIG. 13 shows an example of a gain stage, which is based on an Inductive Interstage Network topology.
Figure 14:
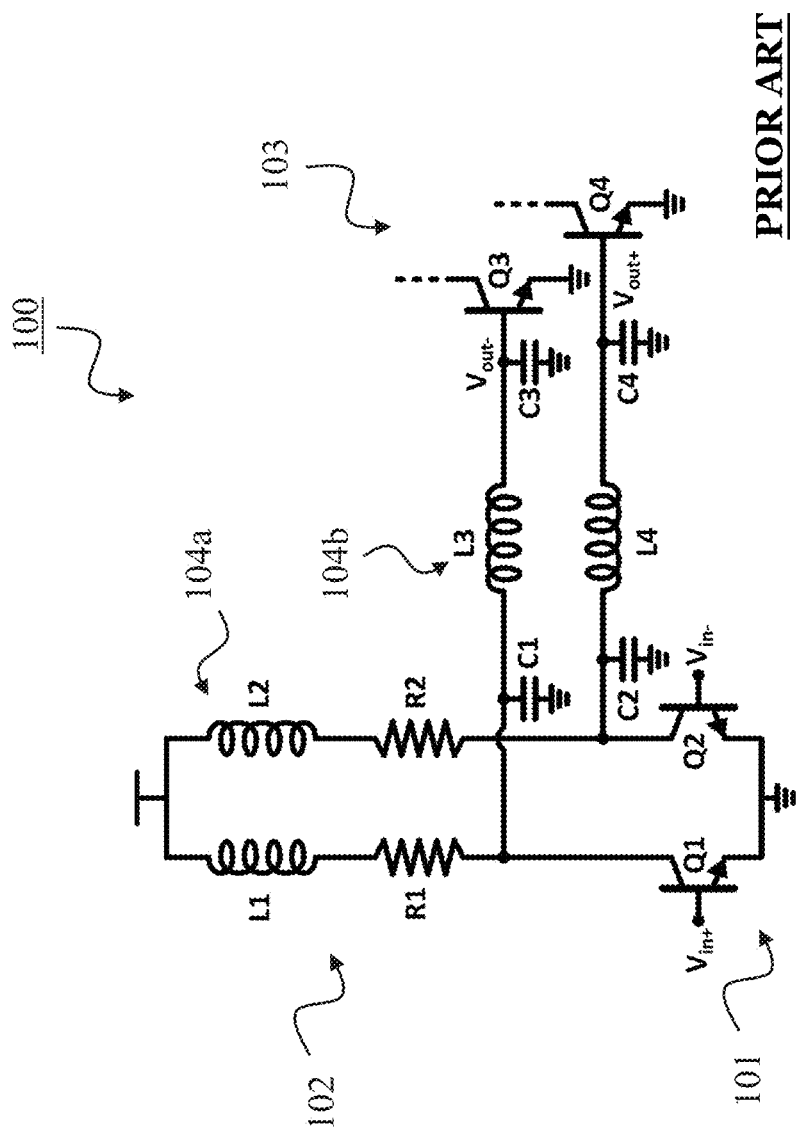
FIG. 14 shows an example of a gain stage, which is based on a TRN topology.
Figure 15:
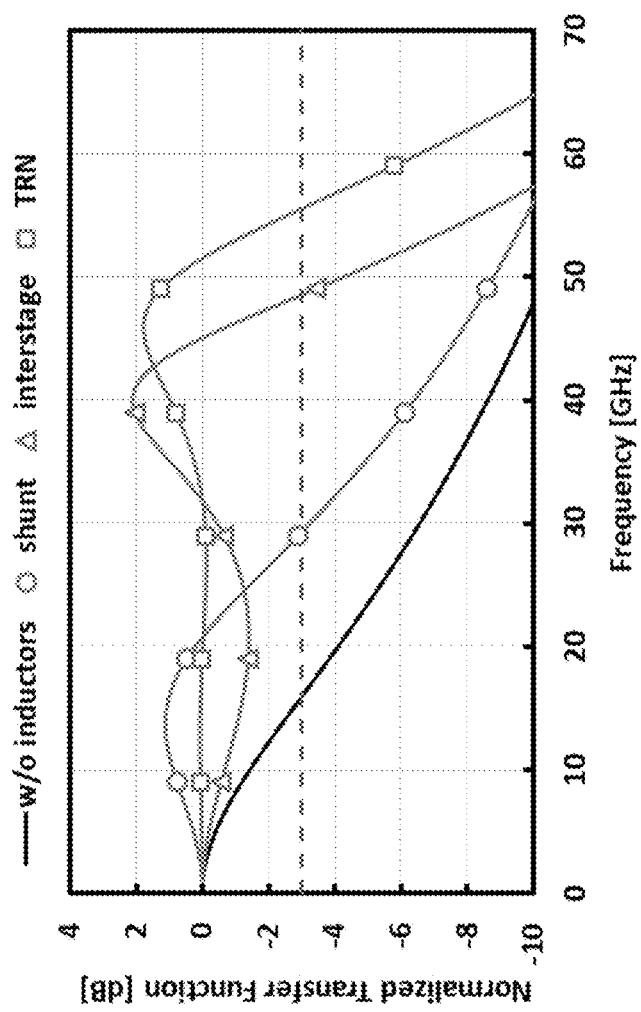
FIG. 15 shows normalized differential gain versus frequency for example gain stages of different topologies.

For the gain stage 100 based on the TRN topology, in which as shown in FIG. 9 two pairs 104a and 104b, of coupled inductances are provided, the compact layout concept of FIG. 8 can be used. That is, the inductances $L1_T$, $L2_T$, $L3_T$, $L4_T$ of both pairs 104a, 104b of inductances may be distributed over at least two separated metal layers. With this layout, another coupling ($k_{cross}$ in FIG. 9) may also be exploited, namely between the inductance pairs 104a, 105b. Its effect is to give an additional boost to the inductance value in the two inductance pairs 104a and 104b, without degrading the CMRR. In other words, the first pair 104a of inductances $L1_T$ and $L2_T$ may be coupled to the second pair 104b of inductances $L3_T$ and $L4_T$. The simulated CMRR of the gain stage 100 shown in FIG. 9 is shown in FIG. 10, again in comparison to a similar gain stage 100 without coupling.

The gain stages 100 according to embodiments of the invention as described above, are suitable to be implemented in a monolithic integrated circuit. Integrated inductances $L1_T$, $L2_T$, $L3_T$, $L4_T$ for high frequency applications may thereby be made of top metal layers or lower metal layers.

Embodiments of the present invention have been described in conjunction with various embodiments as examples as well as implementations. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A gain stage for an amplifier, wherein the gain stage comprises:
    a differential input transconductor comprising a first transistor and a second transistor, wherein the first and second transistors have respective control nodes configured to receive an input signal;
    a loading network directly connected to output nodes of the first and second transistors, the loading network comprising a first pair of inductors directly connected in series with a pair of load resistors, wherein the first pair of inductors are mutually coupled;
    a differential output terminal coupled to the loading network; and a second pair of inductors connected between the differential input transconductor and the differential output terminal, wherein inductors of the second pair of inductors are mutually coupled.

2. The gain stage according to claim 1, wherein:
a first coupling factor between the inductors of the first pair of inductors is the same as a second coupling factor between the inductors of the second pair of inductors.

3. The gain stage according to claim 1, wherein:
a first coupling factor between the inductors of the first pair of inductors is different from a second coupling factor between the inductors of the second pair of inductors.

4. The gain stage according to claim 1, wherein:
the first pair of inductors is mutually coupled to the second pair of inductors.

5. The gain stage according to claim 1, wherein:
a coupling factor between the inductors of at least one pair of inductors is larger than 0.25.

6. The gain stage according to claim 1, wherein:
a coupling factor between the inductors of at least one pair of inductors is in a range of 0.4-0.6.

7. The gain stage according to claim 1, wherein:
the differential output terminal is conductively coupled to control terminals of a third transistor and a fourth transistor.

8. The gain stage according to claim 7, further comprising:
a tail current generator connected to the differential input transconductor.

9. The gain stage according to claim 1, wherein the gain stage is based on a Shunt Peaking topology, an Inductive Interstage Network topology, or a Triple Resonant Network topology.

10. The gain stage according to claim 1, wherein:
the inductors of the first pair of inductors are implemented in Complementary Metal-Oxide-Semiconductor (CMOS) technology, in SiGe Bipolar-CMOS technology, or in GaAs technology.

11. The gain stage according to claim 1, wherein:
the inductors of the first pair of inductors are distributed over at least two separated metal layers.

12. An amplifier, comprising a gain stage, wherein the gain stage comprises:
a differential input transconductor comprising a first transistor and a second transistor, wherein the first and second transistors have respective control nodes configured to receive an input signal;
a loading network directly connected to output nodes of the first and second transistors, the loading network comprising a first pair of inductors directly connected in series with a pair of load resistors, wherein the first pair of inductors are mutually coupled;
a differential output terminal coupled to the loading network; and
a second pair of inductors connected between the differential input transconductor and the differential output terminal, wherein inductors of the second pair of inductors are mutually coupled.

13. The amplifier according to claim 12, wherein the amplifier is a broad-band amplifier, a trans-impedance amplifier, or a driver amplifier.

14. The amplifier according to claim 12, wherein:
a first coupling factor between the inductors of the first pair of inductors is the same as a second coupling factor between the inductors of the second pair of inductors.

15. The amplifier according to claim 12, wherein:
a first coupling factor between the inductors of the first pair of inductors is different from a second coupling factor between the inductors of the second pair of inductors.

16. The amplifier according to claim 12, wherein:
the first pair of inductors is mutually coupled to the second pair of inductors.

17. The amplifier according to claim 12, wherein:
the differential output terminal is conductively coupled to control terminals of a third transistor and a fourth transistor.

18. An amplifier comprising:
a first input transistor;
a second input transistor;
a load network comprising a first terminal coupled to an output node of the first input transistor, a second terminal coupled to an output node of the second input transistor, and a power supply terminal configured to be coupled to a power supply node, the load network comprising:
a first resistor coupled in series with a first inductor between the first terminal and the power supply terminal, and
a second resistor coupled in series with a second inductor between the second terminal and the power supply terminal, wherein the second inductor is mutually coupled to the first inductor;
a third inductor conductively coupled between the first terminal of the load network and a first output node; and
a fourth inductor conductively coupled between the second terminal of the load network and a second output node, wherein the fourth inductor is mutually coupled to the third inductor.

19. The amplifier of claim 18, wherein:
the first inductor and the second inductor form a first pair of inductors;
the third inductor and the fourth inductor form a second pair of inductors; and
the first pair of inductors is mutually coupled to the second pair of inductors.

20. The amplifier of claim 19, wherein a first coupling factor between the inductors of the first pair of inductors is the same as a second coupling factor between the inductors of the second pair of inductors.

* * * * *